(12) United States Patent
Yoshino et al.

(10) Patent No.: US 10,934,622 B2
(45) Date of Patent: Mar. 2, 2021

(54) SUBSTRATE PROCESSING APPARATUS

(71) Applicant: HITACHI KOKUSAI ELECTRIC INC., Tokyo (JP)

(72) Inventors: Teruo Yoshino, Toyama (JP); Naofumi Ohashi, Toyama (JP); Tadashi Takasaki, Toyama (JP); Shun Matsui, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/866,120

(22) Filed: Jan. 9, 2018

(65) Prior Publication Data

US 2019/0085455 A1 Mar. 21, 2019

(30) Foreign Application Priority Data

Sep. 20, 2017 (JP) .............................. JP2017-179783

(51) Int. Cl.
| | |
|---|---|
| *C23C 16/48* | (2006.01) |
| *C23C 16/458* | (2006.01) |
| *C23C 16/46* | (2006.01) |
| *H01L 21/67* | (2006.01) |
| *H01L 21/687* | (2006.01) |
| *C23C 16/455* | (2006.01) |
| *C23C 16/50* | (2006.01) |
| *C23C 16/40* | (2006.01) |
| *C23C 16/34* | (2006.01) |

(52) U.S. Cl.
CPC .......... *C23C 16/481* (2013.01); *C23C 16/345* (2013.01); *C23C 16/402* (2013.01); *C23C 16/4584* (2013.01); *C23C 16/4586* (2013.01); *C23C 16/45523* (2013.01); *C23C 16/46* (2013.01); *C23C 16/50* (2013.01); *H01L 21/67103* (2013.01); *H01L 21/67109* (2013.01); *H01L 21/67161* (2013.01); *H01L 21/67248* (2013.01); *H01L 21/68764* (2013.01); *H01L 21/68771* (2013.01); *H01L 21/68785* (2013.01); *H01L 21/68742* (2013.01)

(58) Field of Classification Search
CPC .................... H01L 21/67703; H01L 21/68764
See application file for complete search history.

(56) References Cited

U.S. PATENT DOCUMENTS

| | | | | |
|---|---|---|---|---|
| 5,880,924 A | * | 3/1999 | Kumar ................ | H01L 21/6831 279/128 |
| 2008/0055813 A1 | * | 3/2008 | Son ..................... | H01L 21/6833 361/234 |
| 2008/0230372 A1 | * | 9/2008 | Cousins .................. | C23C 14/50 204/192.1 |

(Continued)

FOREIGN PATENT DOCUMENTS

JP 2012-222024 A 11/2012

*Primary Examiner* — Karla A Moore
*Assistant Examiner* — Nathan K Ford
(74) *Attorney, Agent, or Firm* — Volpe Koenig

(57) ABSTRACT

A substrate processing apparatus includes a heat storage part on which a substrate is mounted, a tray including the heat storage part, a substrate transfer part including a rotary shaft and a rotating plate supported by the rotary shaft and being configured such that the tray can be mounted on the rotating plate, a plurality of bases arranged circumferentially around the rotary shaft; and a heater provided for each of the bases.

9 Claims, 8 Drawing Sheets

(56) References Cited

U.S. PATENT DOCUMENTS

| | | | |
|---|---|---|---|
| 2015/0279704 A1* | 10/2015 | Suuronen | H01L 21/6875 |
| | | | 165/80.4 |
| 2015/0332912 A1 | 11/2015 | Nowak et al. | |
| 2016/0056032 A1 | 2/2016 | Baldasseroni et al. | |
| 2016/0172165 A1 | 6/2016 | Jeon et al. | |
| 2017/0047239 A1* | 2/2017 | Takebayashi | H01L 21/6833 |

* cited by examiner

SUBSTRATE PROCESSING APPARATUS

CROSS-REFERENCE TO RELATED APPLICATION

This application is based upon and claims the benefit of priority from Japanese Patent Application No. 2017-179783, filed on Sep. 20, 2017, the entire contents of which are incorporated herein by reference.

TECHNICAL FIELD

The present disclosure relates to a substrate processing apparatus.

BACKGROUND

As a substrate processing apparatus, there is an apparatus of a type that processes a plurality of substrates collectively in order to improve production efficiency. For example, there has been proposed an apparatus of a type in which a plurality of substrates are circumferentially arranged in one processing chamber in the related art.

In the proposed apparatus, processing chambers in which a substrate heating table and a shower head are combined are arranged circumferentially. The substrates are heated and processed with plasma in the processing chamber, and a rotary tray is revolved in order to move the substrates to an adjacent processing chamber, etc.

With recent miniaturization, thin films should be uniformly formed on the surface of a substrate. To this end, a substrate processing apparatus is configured to uniformly heat the surface of the substrate and perform plasma treatment on the surface.

SUMMARY

Some embodiments of the present disclosure provide a technique with high processing efficiency in an apparatus of a type in which a plurality of substrates are circumferentially arranged.

According to one embodiment of the present disclosure, there is provided a technology, which includes: a tray having a heat storage part on which a substrate is mounted; a substrate transfer part having a rotary shaft and a rotating plate supported by the rotary shaft and being configured such that the tray can be mounted on the rotating plate; a plurality of bases arranged circumferentially around the rotary shaft; and a heater provided for each of the bases.

DETAILED DESCRIPTION

Figure 1:
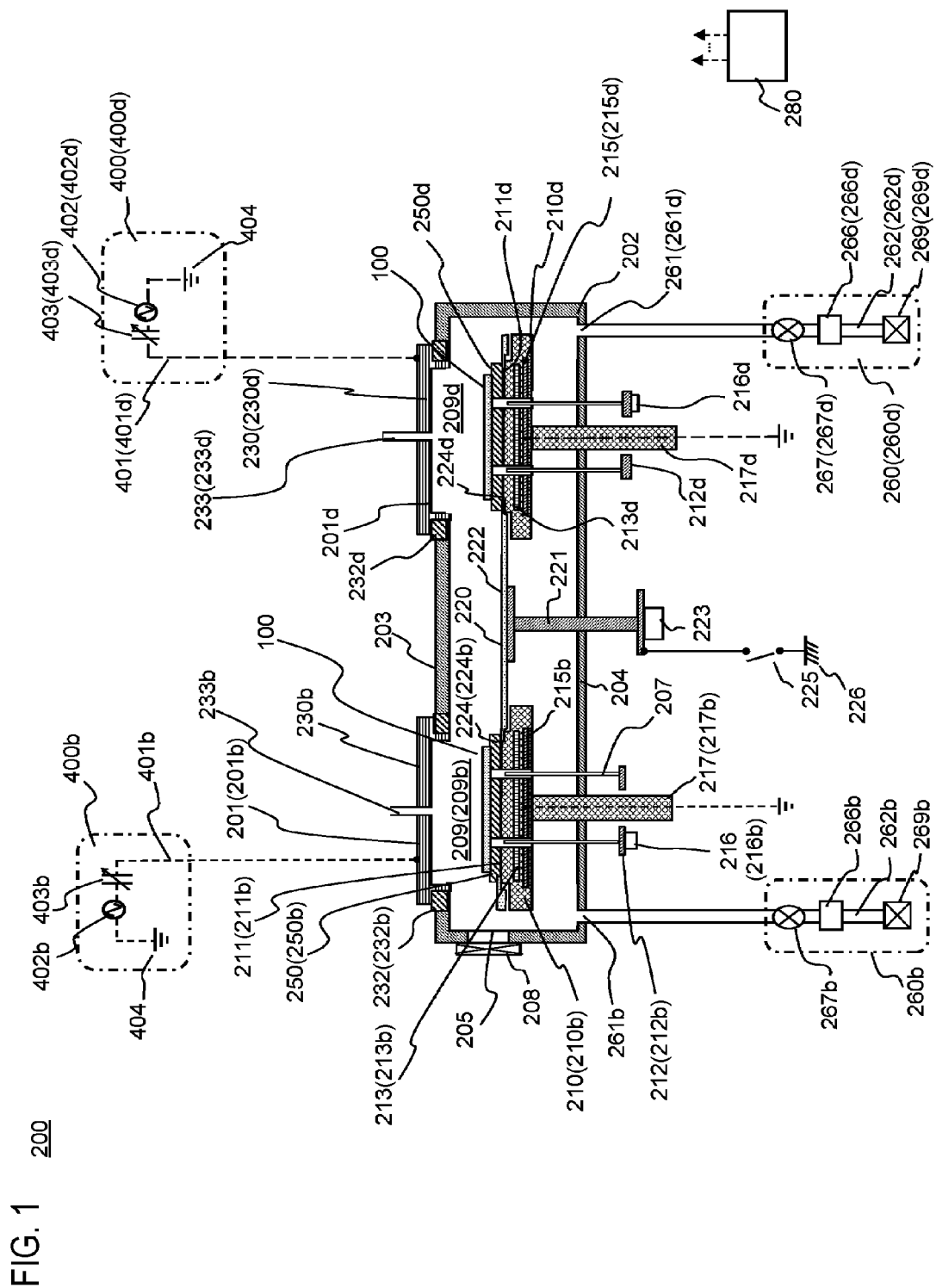
FIG. 1 is an explanatory view illustrating a substrate processing apparatus according to an embodiment.

An embodiment of the present disclosure will be described below.

First, a substrate processing apparatus 200 in this embodiment will be described with reference to FIG. 1.
(Substrate Processing Apparatus)
(Processing Container)

As illustrated in the figure, the substrate processing apparatus 200 includes a container 202. The container 202 is also referred to as a processing module. The container 202 is, for example, a flat closed container having a rectangular cross section. Further, the container 202 is made of, e.g., a metal material such as aluminum (Al) or stainless steel (SUS). A processing chamber 201 for processing a wafer 100 such as a silicon wafer is formed in the container 202. The processing chamber 201 includes a shower head 230, a base 210 and the like which will be described later.

A substrate loading/unloading port 205 adjacent to a gate valve 208 is provided on the side surface of the container 202 and the wafer 100 is moved to and from a transfer chamber (not shown) through the substrate loading/unloading port 205.

The base 210 for heating a tray 250 to be described later is disposed in the processing chamber 201. A plurality of bases 210 are arranged circumferentially around a rotary shaft 221 to be described later. The arrangement of the bases 210 will be described with reference to FIG. 2. FIG. 2 shows the substrate processing apparatus 200, particularly the vicinity of a rotating plate 222 when viewed from above. An arm 240 is disposed outside the processing container 202 and has a function of transferring the wafer 100 into/out of the processing container 202. A longitudinal sectional view taken along line B-B' corresponds to FIG. 1.

At least four bases 210 are provided. Specifically, as shown in FIG. 2, a base 210a, a base 210b, a base 210c and a base 210d are arranged clockwise from a position facing the substrate loading/unloading port 205. The wafer 100 loaded into the container 202 is moved in the order of the base 210a, the base 210b, the base 210c and the base 210d.

The bases 210 mainly include tray mounting surfaces 211 (a tray mounting surface 211a to a tray mounting surface 211d) on which the wafers 100 are placed respectively, bias electrodes 215 (a bias electrode 215a to a bias electrode 215d) and shafts 217 (a shaft 217a to a shaft 217d) which support the bases 210. The bases 210 further include the heaters 213 (213a to 213d) as heating sources. Through-holes through which lift pins 207 penetrate are formed in the bases 210 at positions corresponding to the lift pins 207, respectively. The shafts 217 penetrate a bottom portion 204 of the processing container 202. The shafts 217 are insulated from the processing container 202.

The lift pins 207 are provided so as to penetrate the bottom portion 204. The lift pins 207 are disposed at positions where they can pass through the through-holes formed in the bases 210 and through-holes formed in the tray 250 to be described later. The tips of the lift pins 207 support the wafer 100 at the time of substrate loading/unloading or the like.

Lift pin supports 212 (212a to 212d) are provided on the lower ends of the lift pins 207, respectively. The lift pin supports 212 are provided with substrate lifting parts 216

(216a to 216d) respectively. The substrate lifting parts 216 lift up/down the lift pins 207. The lift pin supporters 212 and the substrate lifting parts 216 are provided corresponding to the bases 210a to 210d respectively.

Figure 3:
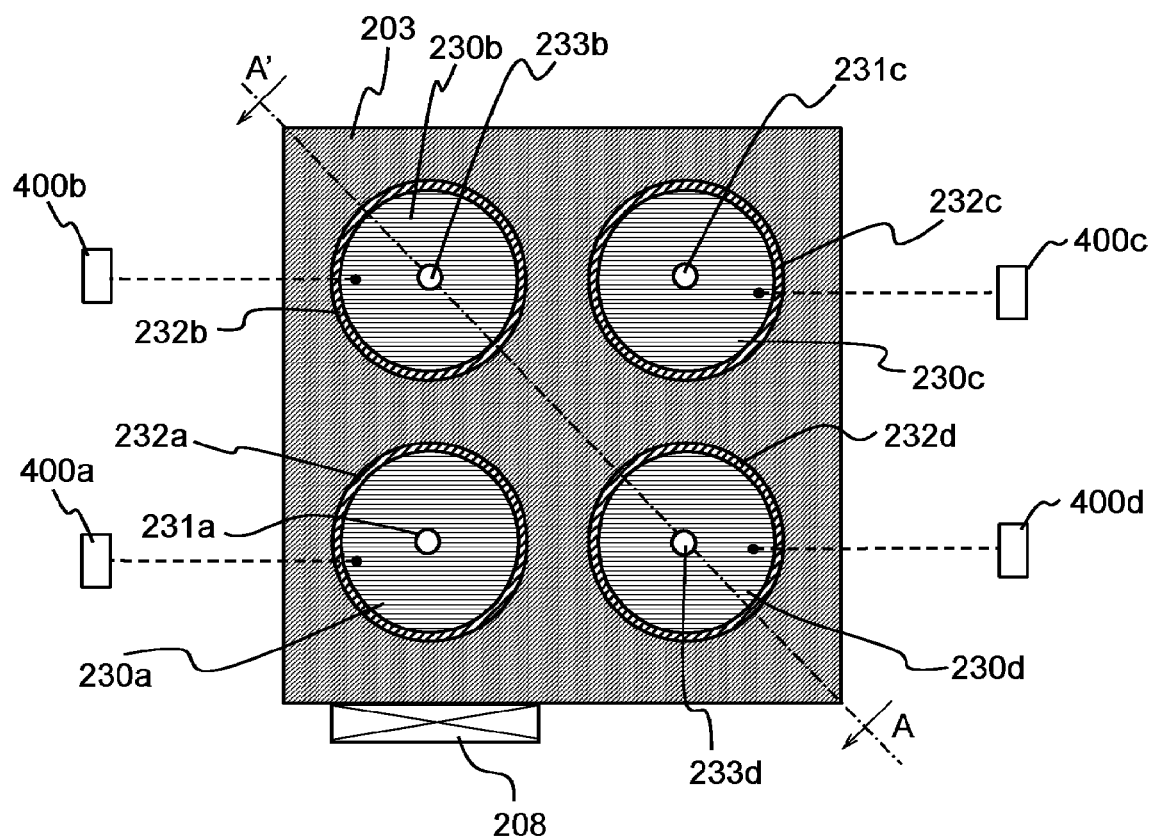
FIG. 3 is an explanatory view illustrating a substrate processing apparatus according to an embodiment.

Shower heads 230 (230a to 230d) as a gas dispersion mechanism are provided at positions facing the tray mounting surfaces 211 respectively and constituting a cover part 203 of the processing container 202. As shown in FIG. 3, a plurality of shower heads 230 is arranged when viewed from above. The shower heads 230 are supported on the cover part 203 via insulating rings 232 (232a to 232d) respectively. The shower heads 230 and the processing container 202 are insulated from each other by the insulating rings 232.

As shown in FIG. 3, a gas introduction hole is formed in each of the shower heads 230. Specifically, a gas introduction hole 231a is formed in the shower head 230a, a gas introduction hole 233b is formed in the shower head 230b, a gas introduction hole 231c is formed in the shower head 230c, and a gas introduction hole 233d is formed in the shower head 230d. The gas introduction holes 231a and 231c are in communication with a common gas supply pipe 301 to be described later. The gas introduction holes 233b and 233c are in communication with a common gas supply pipe 341 to be described later. A longitudinal sectional view taken along line A-A' in FIG. 3 corresponds to FIG. 1.

A space between each shower head 230 and each tray 250 is called a processing space 209. In the present embodiment, the space between the shower head 230a and the tray 250a is called a processing space 209a. The space between the shower head 230b and the tray 250b is called a processing space 209b. The space between the shower head 230c and the tray 250c is called a processing space 209c. The space between the shower head 230d and the tray 250d is called a processing space 209d.

Further, a structure constituting the processing space 209 is called a processing chamber 201. In the present embodiment, a structure constituting the processing space 209a and including at least the shower head 230a and the base 210a is called a processing chamber 201a. A structure constituting the processing space 209b and including at least the shower head 230b and the base 210b is called a processing chamber 201b. A structure constituting the processing space 209c and including at least, the shower head 230c and the base 210c is called a processing chamber 201c. A structure constituting the processing space 209d and including at least the shower head 230d and the base 210d is called a processing chamber 201d.

Although it is described here that the processing chamber 201a has at least the shower head 230a and the base 210a, it may be any structure as long as it constitutes the processing space 209a for processing the wafer 100. It goes without saying that it is not limited to the shower head 230a or the like depending on the structure of the apparatus. The same is true for the other processing chambers.

As shown in FIG. 2, each base 210 is arranged around the rotary shaft 221 of a substrate rotating part 220. The rotating plate 222 is provided on the rotary shaft 221. Further, the rotary shaft 221 is configured to pass through the bottom portion 204 of the processing container 202 and a rotating plate lifting part 223 is provided outside the processing container 202 on the side different from a rotating tray. The rotating plate lifting part 223 lifts or rotates the rotary shaft 221. The rotating plate lifting part 223 allows the rotary shaft 221 to be lifted independently from each base 210. The rotary shaft 221 is rotated, for example, in the direction of an arrow 225 in FIG. 2 (clockwise direction). The rotary shaft 221, the rotating plate 222 and the rotating plate lifting part 223 are collectively referred to as a substrate rotating part. The substrate rotating part 220 is also referred to as a substrate transfer part. Since the rotating plate lifting part 223 also lifts the tray 250, which will be described later, it is also referred to as a tray lifting part.

Further, any one or all of combinations of the substrate lifting part and the rotating plate lifting part may be collectively referred to as a lifting part.

The rotating plate 222 is configured, for example, in a disc shape. The same number of holes 224 (224a to 224d) as the bases 210, which have at least the same diameter as the tray mounting surface 211, are formed at the outer peripheral edge of the rotating plate 222. Further, the rotating plate 222 has a plurality of claws protruding toward the inside of the holes 224. The claws are configured to support the back side of the tray 250. In this embodiment, the phrase "placing the tray 250 in the holes 224" refers to placing the tray 250 on the claws.

As the rotary shaft 221 rises, the rotating plate 222 is positioned at a position higher than the tray mounting surface 211, and at this time the tray 250 mounted on the tray mounting surface 211 is picked up by the claws of the rotating plate 222. Further, as the rotary shaft 221 is rotated, the rotating plate 222 is rotated and the tray 250 thus picked up is moved onto the next tray mounting surface 211. For example, the tray 250 mounted on the tray mounting surface 211b is moved onto the tray mounting surface 211c. Thereafter, the rotary shaft 221 is lowered to lower the rotating plate 222. At this time, the tray 250 is mounted on the tray mounting surface 211 by lowering the rotary shaft 221 until the holes 224 are positioned below the tray mounting surface 211.

A switch 225 is electrically connected to the side of the rotary shaft 221 which is different from the rotating plate 222. The switch 225 has one side electrically connected to the rotating plate 222 and the other side connected to the ground 226. Therefore, the rotating plate 222 is connected to the ground 226 via the rotary shaft 221 and the switch 225.

(Exhaust System)

Exhaust systems 260 for exhausting the atmosphere of the container 202 will be described. Exhaust systems 260 are provided corresponding to the respective processing spaces 209 (209a to 209d). For example, the processing space 209a corresponds to an exhaust system 260a, the processing space 209b corresponds to an exhaust system 260b, the processing space 209c corresponds to an exhaust system 260c, and the processing space 209d corresponds to an exhaust system 260d.

The exhaust systems 260 includes exhaust pipes 262 (262a to 262d) communicating with the exhaust holes 261 (261a to 261d) respectively and further include APCs (Auto Pressure Controllers) 266 (266a to 266d) provided in the exhaust pipes 262 respectively. Each of the APCs 266 includes a valve element (not shown) whose opening can be adjusted, and adjusts conductance of the corresponding exhaust pipe 262 according to an instruction from a controller 280. Further, valves 267 (267a to 267d) are respectively provided in the exhaust pipes 262 in the upstream side of the APCs 266.

The exhaust pipes 262, the valves 267 and the APCs 266 are collectively called an exhaust system 260.

Further, the exhaust pipes 262, the valves 267 and the APCs 266 are collectively called an exhaust part. DPs (Dry pumps) 269 are respectively provided in the downstream of the exhaust pipes 262. The DPs 269 exhaust the atmosphere of the processing chambers 201 through the exhaust pipes 262. In the present embodiment, the DPs 269 are provided for the respective exhaust systems 260. However, the present disclosure is not limited thereto, but a single DP may be used in common for the exhaust systems.

(Tray)

Figure 4:
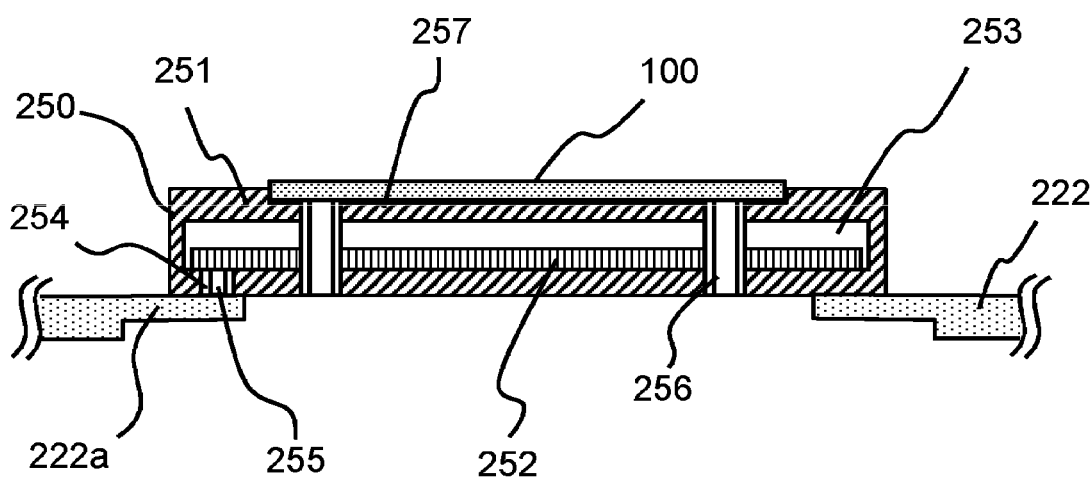
FIG. 4 is an explanatory view illustrating a substrate processing apparatus according to an embodiment.

Subsequently, the detailed structure of the tray 250 will be described with reference to FIG. 4. FIG. 4 shows a state in which the tray 250 is placed on the rotating plate 222. The tray 250 mainly includes a heat storage part 251 and a neutralizing electrode 252. A space 253 is formed inside the heat storage part 251. The neutralizing electrode 252 is disposed at the bottom of the space 253. That is, the heat storage part 251 is provided so as to cover the neutralizing electrode 252. A wafer mounting surface 257 on which the wafer 100 is mounted is provided on the surface of the heat storage part 251. Furthermore, a through-hole 256 is provided to penetrate the tray 250. The through-hole 256 is a hole through which a lift pin 207 penetrates.

The heat storage part 251 accumulates heat conducted from the heater 213 when the tray 250 is placed on the base 210. The heat storage part 251 has plasma-resistant properties and is made of, for example, opaque quartz. As will be described later, the heat storage part 251 maintains the temperature of the wafer 100.

The neutralizing electrode 252 functions to neutralize the tray 250 charged when plasma is generated in the processing space 209. The neutralizing electrode 252 is made of, for example, silicon carbide (SiC). The neutralizing electrode 252 is formed in a disc shape. The diameter of the neutralizing electrode 252 is, for example, slightly larger than the diameter of the wafer 100.

When coefficient of thermal expansion of the neutralizing electrode 252 is higher than that of the heat storage part 251, a gap is formed between the side surface and upper surface of the neutralizing electrode 252 and the heat storage part 251. Since the heat storage part 251 is configured to cover the neutralizing electrode 252, the neutralizing electrode 252 is not exposed to the plasma generated in the processing space 209.

A hole 254 is formed in the bottom of the heat storage part 251 and a terminal 255 penetrates through the hole 254. The terminal 255 is made of the same material as the neutralizing electrode 252, for example, SiC. The neutralizing electrode 252 and the terminal 255 are electrically connected to each other. Therefore, the neutralizing electrode 252 is connected to the ground 226 via the terminal 255, the rotating plate 222 and the switch 225. In the present embodiment, the neutralizing electrode 252 and the terminal 255 are collectively called a neutralizing part.

The terminal 255 is provided at a position that does not overlap with the wafer 100 in the horizontal direction, for example, outside the diameter of the wafer 100, the reason for which will be described below. The terminal 255 is heated by the heater 213 and the heat storage part 251. If the terminal 255 is disposed below the wafer 100, the wafer 100 is locally heated by the heat accumulated in the terminal 255. Since the wafer 100 is thermally affected by the locally heated terminal 255, it is difficult to make the temperature of the wafer 100 uniform. On the other hand, when the terminal 255 is disposed at a position that does not overlap with the wafer 100, heat influence by the terminal 255 can be reduced to prevent the terminal 255 from being locally heated, thereby allowing the wafer 100 to be uniformly heated.

The tray 250 is disposed so that the hole 254 on the rotating plate 222 side is blocked by the rotating plate 222. It is shown in FIG. 4 that the rotating plate 222 side is blocked by claws 222a of the rotating plate 222. Such a structure can prevent plasma generated during wafer processing from going into the hole 254 and the space 253.

In this manner, since the neutralizing electrode 252 and the terminal 255 are not exposed to the plasma, the neutralizing electrode 252 and the terminal 255 are not etched by the plasma, thereby preventing particles and the like from being generated due to etching.

Here, a comparative example in which it is assumed that the tray 250 does not exist will be described. As described above, in this embodiment of the apparatus, the heater 213 is provided for each base 210. In other words, there is no heater 213 between adjacent bases 210. Therefore, while the wafer 100 is being moved to an adjacent base 210, there is a possibility that the temperature of the wafer 100 decreases. In particular, since the inside of the housing 202 is in a vacuum, the temperature decreases remarkably. The decrease in temperature of the wafer may result in decreases in productivity, deflection of the water, etc. as will be described later. Therefore, in the present embodiment, by providing the heat storage part 251 in the tray 250, it is possible to maintain the temperature of the wafer 100 even while it is being moved to the adjacent base 210.

(Gas Supply Part)
(First Gas Supply Part 300)

Figure 5:
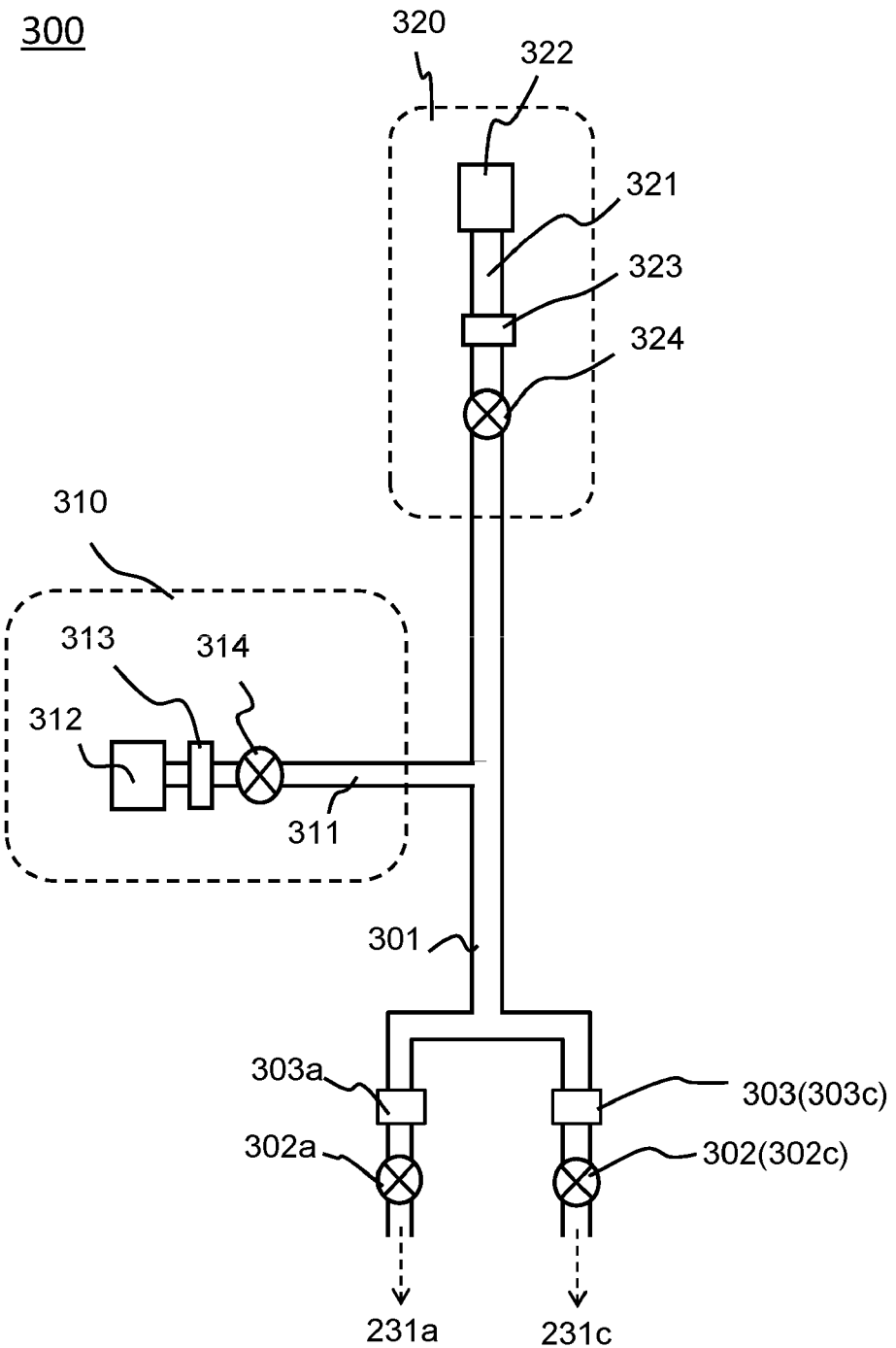
FIG. 5 is an explanatory view illustrating a substrate processing apparatus according to an embodiment.

Subsequently, a first gas supply part 300 will be described with reference to FIG. 5. Here, a first processing gas supply part 300 connected to the gas introduction holes 231 (231a and 231c) will be described.

Shower heads 320a and 320c are connected to the common gas supply pipe 301 via valves 302 (302a and 302c) and mass flow controllers 303 (303a and 303c) so that the gas introduction holes 231a and 231c communicate the common gas supply pipe 301. The amount of supply of gas to each processing chamber is adjusted by using the valves 302 (302a and 302c) and the mass flow controllers 303 (303a and 303c). A first gas supply pipe 311 and a second gas supply pipe 321 are connected to the common gas supply pipe 301.

(First Gas Supply System)

A first gas source 312, a mass flow controller (MFC) 313 which is a flow rate controller (flow rate control part), and an opening/closing valve 314 are provided in the first gas supply pipe 311 in order from the upstream direction.

The first gas source 312 is a source of a first gas containing a first element (also referred to as a "first element-containing gas"). The first element-containing gas is one of the precursor gases, that is, processing gases. Here, the first element is silicon (Si). That is, the first element-containing gas is a silicon-containing gas. Specifically, a dichlorosiiane ($SiH_2Cl_2$, also referred to as DCS) gas or a hexachlorodisilane ($Si_2Cl_6$, also referred to as HCDS) gas is used as the silicon-containing gas.

A first gas supply system 310 (also referred to as a silicon-containing gas supply system) is mainly constituted by the first gas supply pipe 311, the mass flow controller 313 and the valve 314.

(Second Gas Supply System)

A second gas source 322, a mass flow controller (MFC) 323 which is a flow rate controller (flow rate control part), and an opening/closing, valve 324 are provided in the second gas supply pipe 321 in order from the upstream direction.

The second gas source 322 is a source of second gas containing a second element (hereinafter also referred to as a "second element-containing gas"). The second element-containing gas is one of the processing gases. Incidentally, the second element-containing gas may be regarded as a reaction gas.

Here, the second element-containing gas contains a second element different from the first element. The second element is, for example, oxygen (O). In the present embodiment, the second element-containing gas is, for example, an oxygen-containing gas. Specifically, an ozone ($O_3$) gas is used as the oxygen-containing gas.

A second gas supply system 320 (also referred to as a reaction gas supply system) is mainly constituted by the second gas supply pipe 321, the mass flow controller 323 and the valve 324.

Any one of the first gas supply system and the second gas supply system or a combination thereof is referred to as a first gas supply part 300.

(Second Gas Supply Part 340)

Figure 6:
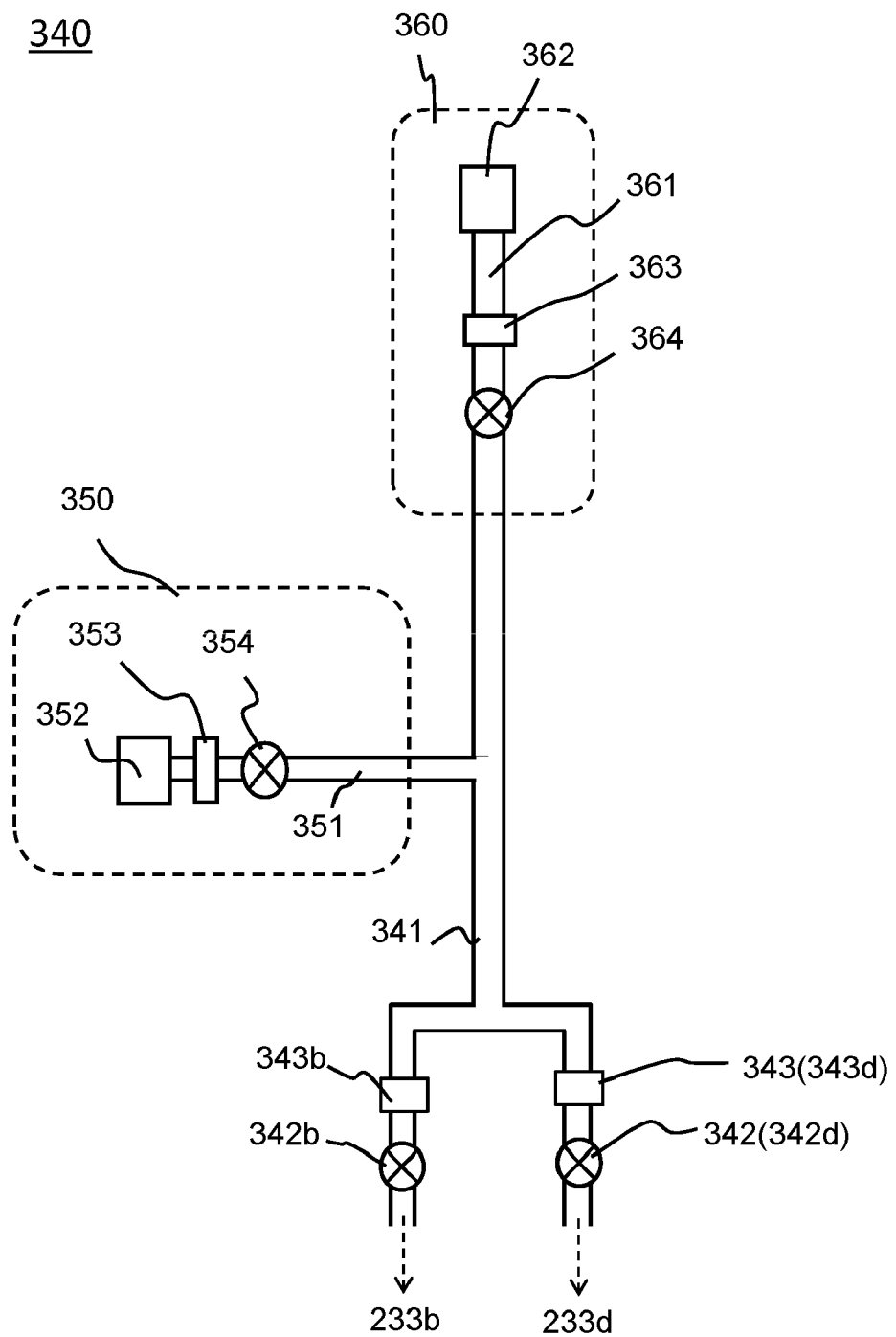
FIG. 6 is an explanatory view illustrating a substrate processing apparatus according to an embodiment.

Subsequently, a second gas supply part 340 will be described with reference to FIG. 6. Now, the second gas supply part 300 connected to each of the gas introduction holes 233 will be described.

Shower heads 320b and 320d are connected to the common gas supply pipe 301 via valves 342 (342b and 342d) and mass flow controllers 343 (343a to 343c) so that the gas introduction holes 233b and 233d communicate with the common gas supply pipe 341. The amount of supply of gas to each processing chamber is adjusted by using the valves 342 (342b and 342d) and the mass flow controllers 343 (343b and 343d). A third gas supply pipe 351 and a fourth gas supply pipe 361 are connected to the common gas supply pipe 341.

(Third Gas Supply System)

A third gas source 352, a mass flow controller (MFC) 353 which is a flow rate controller (flow rate control part), and an opening/closing valve 354 are provided in the third gas supply pipe 351 in order from the upstream direction.

The third gas source 352 is a source of first gas containing a first element (also referred to as a "first element-containing gas"). Like the first gas source 312, a silicon-based gas is used. The third gas source 352 may be shared with the first gas source 312.

A third gas supply system 350 (also referred to as a silicon-containing gas supply system) is mainly constituted by the third gas supply pipe 351, the mass flow controller 353 and the valve 354.

(Fourth Gas Supply System)

A fourth gas source 362, a mass flow controller (MFC) 363 which is a flow rate controller (flow rate control part), and an opening/closing, valve 364 are provided in the fourth gas supply pipe 341 in order from the upstream direction.

The fourth gas source 362 is a source of a third gas containing a third element (hereinafter also referred to as a "third element-containing gas"). The third element-containing gas is one of the processing gases. Incidentally, the third element-containing gas may be regarded as a reaction gas.

Here, the third element-containing gas contains a third element different from the second element. The third element is, for example, nitrogen (N). In the present embodiment, the third element-containing gas is, for example, a nitrogen-containing gas. Specifically, an ammonia ($NH_3$) gas is used as the nitrogen-containing gas.

A fourth gas supply system 360 (also referred to as a reaction gas supply system) is mainly constituted by the fourth gas supply pipe 361, the mass flow controller 363 and the valve 364.

Any one of the third gas supply system and the fourth gas supply system or a combination thereof is referred to as a second as supply part 340.

(Plasma Generating Part)

Subsequently, returning to FIGS. 1 and 3, a plasma generating part 400 will be described. The plasma generating part 400 generates plasma in the processing space 209. In the present embodiment, as shown in FIG. 3, the plasma generating part 400 includes a first plasma generating part 400a for generating plasma in the processing space 209a, a second plasma generating part 400b for generating plasma in the processing space 209b, a third plasma generating part 400c for generating plasma in the processing space 209c, and a fourth plasma generating part 400d for generating plasma in the processing space 209d. In the present embodiment, the second plasma generating part 400b and the fourth plasma generating part 400d are used in conjunction with a substrate processing method to be described later.

Subsequently, a specific configuration of each plasma generation part 400 will be described. Since the first plasma generating part 400a, the second plasma generating part 400b, the third plasma generating part 400c and the fourth plasma generating part 400d have the same configuration, the specific configuration of the plasma generating part 400 will be described here.

Figure 2:
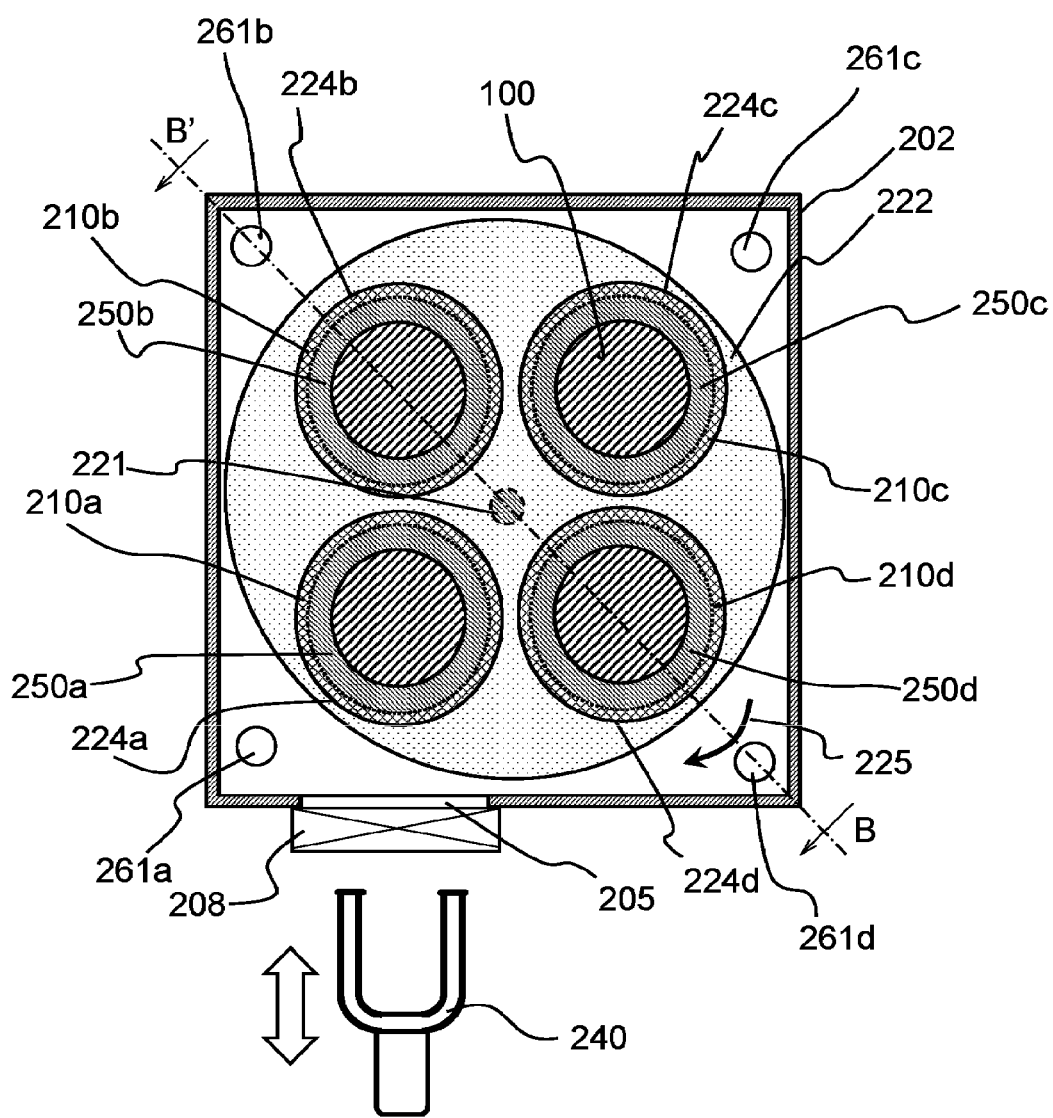
FIG. 2 is an explanatory view illustrating a substrate processing apparatus according to an embodiment.

As shown in FIG. 1, high frequency power supply lines 401 (401a to 401d), which are components of the respective plasma generating parts 400, are respectively connected to the shower heads 230 (230a to 230d). High frequency power supplies 402 (402a to 402d) and matching devices 403 (403a to 403d) are provided in the high frequency power supply lines 401 respectively in order from the upstream. The high frequency power supplies 402 are connected to the ground 404.

The high frequency power supply lines 401 (401a to 401d) and the high frequency power supplies 402 (402a to 402d) are collectively referred to as plasma generating parts 400 (400a to 400d).

(Controller)

Figure 7:
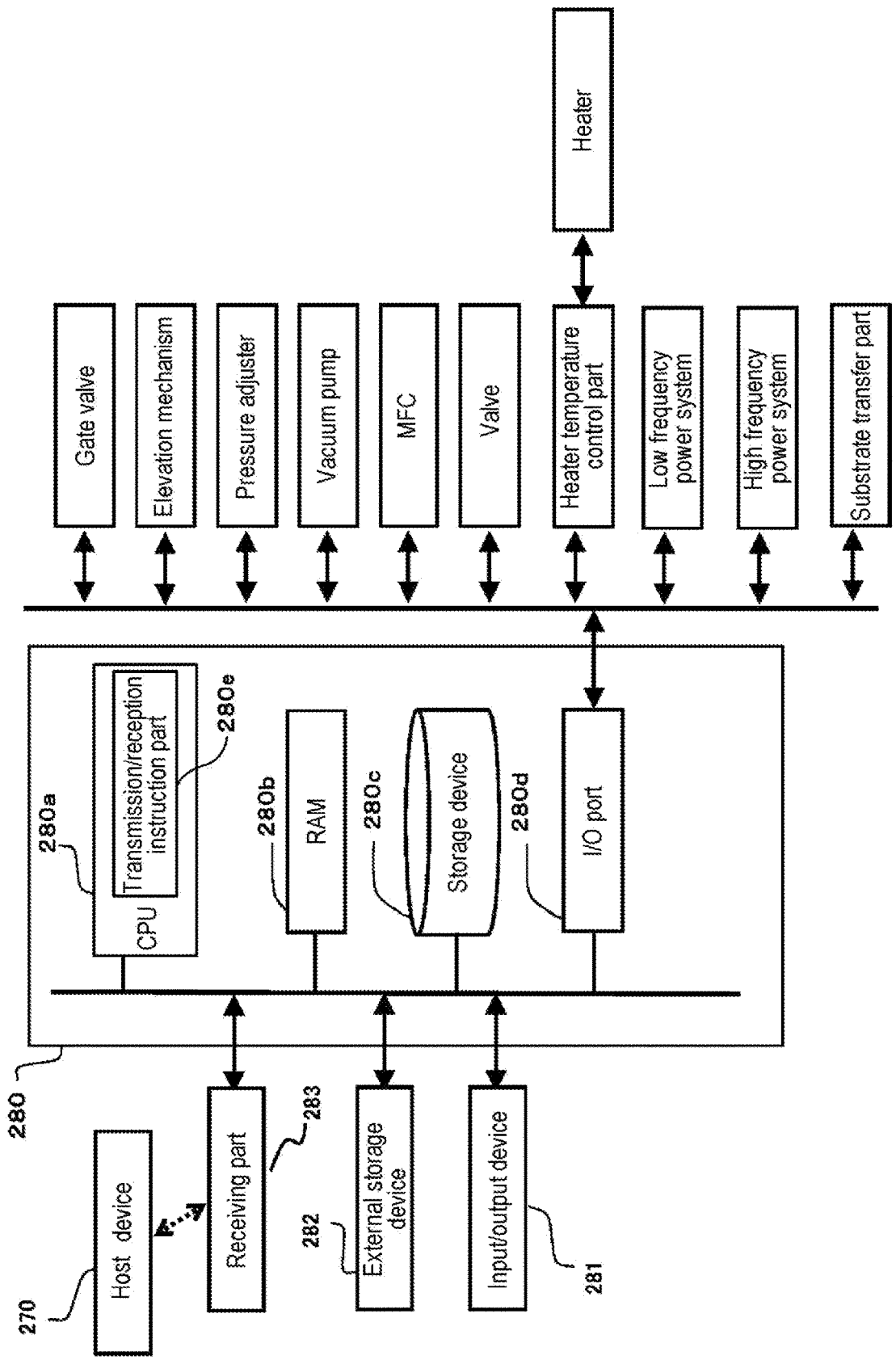
FIG. 7 is an explanatory view illustrating a substrate processing apparatus according to an embodiment.

The substrate processing apparatus 200 includes the controller 280 for controlling the operation of each part of the substrate processing apparatus 200. As shown in FIG. 7, the controller 280 includes at least an arithmetic part (CPU) 280a, a temporary storage part (RAM) 280b, a storage part 280c and an I/O port 280d. The controller 280 is connected to each part of the substrate processing apparatus 200 via the I/O port 280d, calls a program or a recipe from the storage part 280c according to an instruction from a host device 270 or a user, and controls the operation of each part such as the plasma generating part 400 according to the contents of the called program or recipe. Transmission/reception control is performed, for example, by a transmission/reception instruction part 280e in the arithmetic part 280a. The controller 280 may be configured as a dedicated computer or a general-purpose computer. For example, the controller 280 according to the present embodiment may be configured by installing a program in a general-purpose computer using an external storage device 282 (for example, a magnetic tape, a magnetic disk such as a flexible disk or a hard disk, an optical disk such as a CD or a DVD, a magneto optical disk such as an MO, a semiconductor memory such as a USB memory (USB flash drive) or a memory card, etc.) which store the aforementioned program. A means for supplying a program to a computer is not limited to the case where the program is supplied via the external storage device 282. For example, a communication means such as the Internet or a dedicated line may be used, or information may be received from the host device 270 via a receiving part 283 to supply the program without going through the external storage device 282. Further, the controller 280 may be instructed by using an input/output device 281 such as a keyboard or a touch panel.

The storage part 280c and the external storage device 282 are configured as a computer-readable recording medium. Hereinafter, these are collectively referred to simply as a recording medium. The term "recording medium" used herein may include only e storage part 280c alone, only the external storage device 282 alone, or both.

(Substrate Processing Method)

Figure 8:
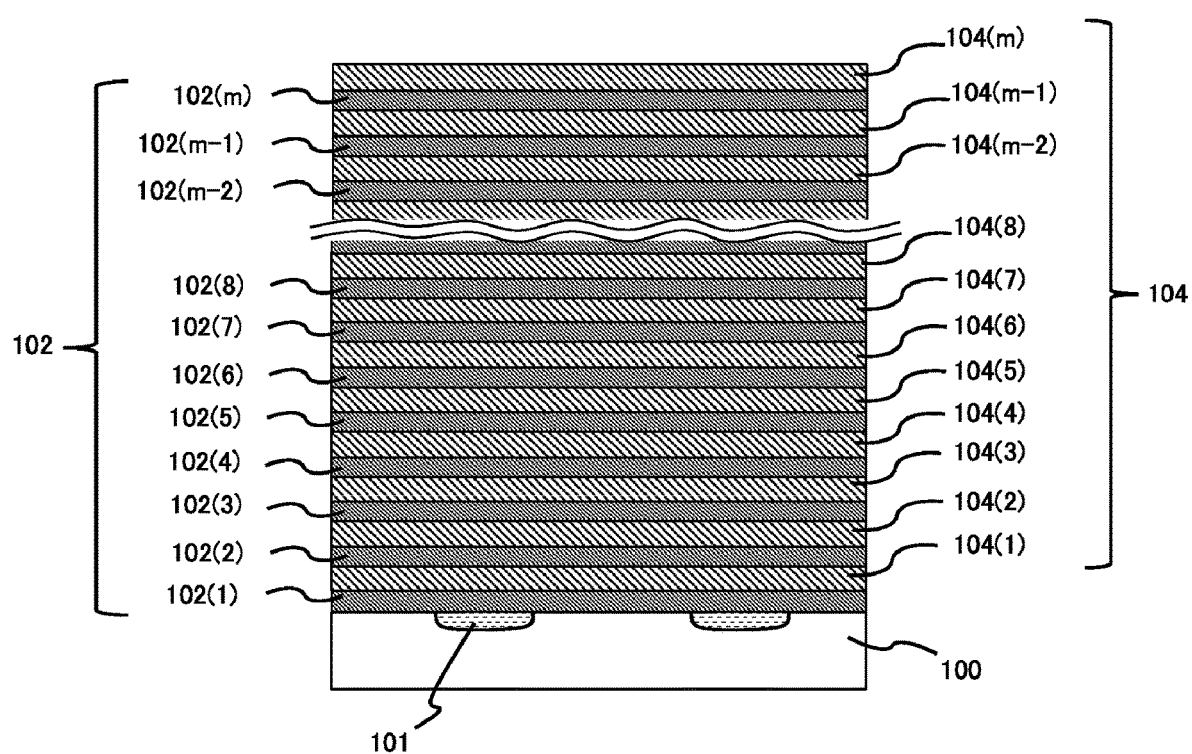
FIG. 8 is an explanatory view for explaining a state of processing of a wafer according to an embodiment.

Subsequently, a substrate processing method will be described with reference to FIGS. 8 and 9. The substrate processing method in the present embodiment relates to one process of forming a semiconductor device having a three-dimensional structure in which electrodes are three-dimensionally formed. Here, as shown in FIG. 8, a laminated structure in which insulating films 102 and sacrificial films 104 are alternately laminated on a wafer 100 is formed.

Figure 9:
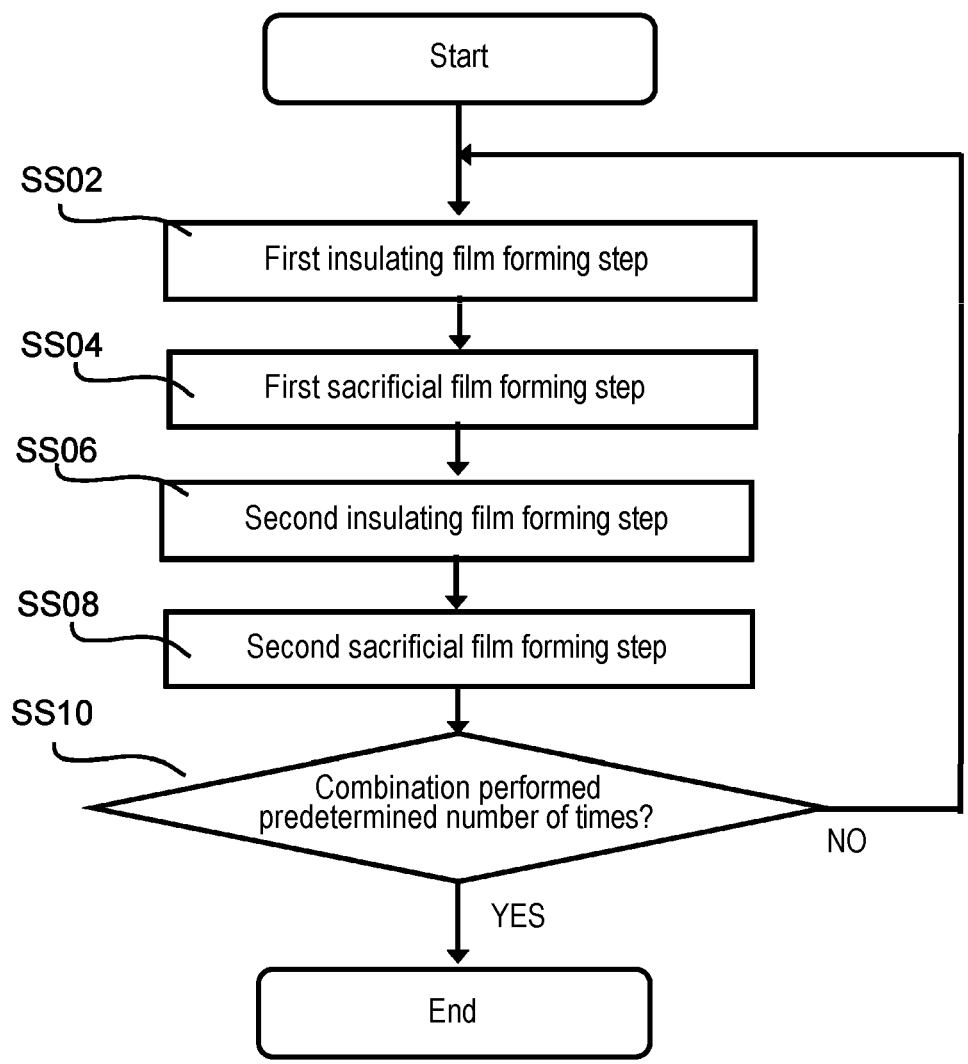
FIG. 9 is an explanatory view for explaining a flow of processing of a wafer according to an embodiment.

FIG. 9 shows a flow of laminating the insulating films 102 and the sacrificial films 104 mainly composed of a single wafer 100. Hereinafter, the substrate processing method will be described in association of the flow of FIG. 9 with the operation of the substrate processing apparatus 200. A flow mainly composed of the operation of the substrate processing apparatus 200 is defined by AS(Apparatus Step)02 to AS28 and a flow mainly composed of the processing of a substrate is defined as SS(Substrate Step)02 to SS10.

In the present embodiment, an example in which four wafers 100 are processed in the container 202 will be described. Here, it is assumed that a wafer 100 which is initially put into the container 202 is a first wafer 100(1), a wafer 100 which is put into the container 202 after the first wafer 100(1) is a second wafer 100(2), a wafer 100 which is put into the container 202 after the second wafer 100(2) is a third wafer 100(3), and a wafer 100 which is put into the container 202 after the third wafer 100(3) is a fourth wafer 100(4).

(Substrate Loading Step AS02)

A substrate loading step AS02 of loading a wafer 100 into the container 202 will be described. The wafer 100 to be put into the container 202 has a common source line (CSL) 101 formed therein.

In the substrate processing apparatus 200, as shown in FIG. 2, the hole 224a is adjacent to the substrate loading/unloading port 205 before loading the wafer 100. Therefore, the hole 224a and the tray 250a are disposed on the tray mounting surface 211a.

The arm 240 enters the processing chamber 201 from the substrate loading/unloading port 205 and mounts the wafer 100 on the tray 250. In the present embodiment, the wafer 100(1) is mounted on the wafer mounting surface 257a of the tray 250a adjacent to the substrate loading/unloading port 205.

After mounting the wafer 100(1), the rotating plate 222 is lowered. By this operation, the tray 250a is mounted on the tray mounting surface 211a. When the tray 250a is mounted on the tray mounting surface 211a, the gate valve 208 is closed to hermetically seal the interior of the container 202. In this manner, the wafer 100(1) is moved to the processing space 209a.

When the trays 250 are mounted on the respective tray mounting surfaces 211, power is supplied to each heater 213 so that a temperature of a surface of the wafer 100 is controlled to reach a predetermined temperature. For example, the temperature of the wafer 100 is equal to or higher than room temperature and is equal to or lower than 800 degrees C. and, in some embodiments, may be equal to or higher than room temperature and equal to or lower than 700 degrees C. At this time, the temperature of the heater 213 is adjusted by the controller 280 extracting a control value based on temperature information detected by a temperature sensor (not shown) and controlling a state of electrical conduction to the heater 213.

(Gas Supplying Step AS04)
(Processing in Processing Space 209)

Here, a gas supplying step AS04 of supplying a gas into the processing space 209 will be described. Taking the wafer 100(1) as a main body, the gas supplying step AS04 corresponds to a first insulating film forming step SS02 of the wafer 100(1).

When the wafer 100(1) moved to the processing space 209a is maintained at a predetermined temperature, the first gas supply part 300 and the second gas supply part 340 are controlled so as to supply a silicon-containing gas and an oxygen-containing gas into the processing space 209a while preventing these processing gases from being supplied into the other processing spaces 209b, 209c and 209d. At this time, the heat storage part 251 of the tray 250a accumulates heat conducted from the heater 213.

In the processing space 209a, the silicon-containing gas and the oxygen-containing gas react with each other to form a silicon oxide film as an insulating film 102(1) on the wafer 100(1).

(AS06)

When plasma is used in the gas supplying step AS04, a neutralizing step AS06 of neutralizing the tray 250 is performed after this step AS04. Neutralization of the tray 250 will be described in detail later. The neutralizing step AS06 may be omitted if no plasma is generated.

(Substrate Moving Step AS08)

Here, a substrate moving step AS08 of moving the wafer 100(1) and loading the wafer 100(2) will be described.

The rotating plate 222 is raised to separate the tray 250 from the tray mounting surface 211. Thereafter, the rotating plate 222 is rotated by 90 degrees in the clockwise direction so that the hole 224a is moved onto the tray mounting surface 211b. When the rotation is completed, the hole 224a is arranged on the tray mounting surface 211b and the hole 224d and the tray 250d are arranged on the tray mounting surface 211a. When the rotation is completed, the gate valve 208 is opened and the wafer 100(2) is mounted on the tray 250d. Thereafter, the tray 250a of the hole 224a is mounted on the tray mounting surface 211b and the tray 250d of the hole 224d is mounted on the tray mounting surface 211a.

Although no heater is provided between adjacent bases 210, since the tray 250 has the heat storage part 251, the temperature of the wafer 100 is maintained even while being moved to the adjacent bases 210.

In this step, the tray 250 is arranged so that the terminal 255 is in electrical contact with the rotating plate 222 and further the holes 254 are blocked by the rotating plate 222.

(Gas Supplying Step AS10)

Here, a gas supplying step AS10 of supplying a gas into the processing space 209a will be described. Taking the wafer 100 as a main body, the gas supplying step AS10 corresponds to a first sacrificial film forming step SS04 of the wafer 100(1). Further, the step AS10 corresponds to a first insulating film forming step SS02 of the wafer 100(2). In the step AS10, the switch 225 is turned off to separate the rotating plate 222 from the ground 226.

(Processing in Processing Space 209a)

In the processing space 209a, the same processing as the processing space 209a in the gas supplying step AS04 is performed on the wafer 100(2). By doing so, an insulating film 102(1) is formed on the wafer 100(2).

(Processing in Processing Space 209b)

In the processing space 209b, a silicon-containing gas and a nitrogen-containing gas are supplied to the wafer 100(1). At this time, in order to decompose the nitrogen-containing gas, the plasma generating part 400b places the nitrogen-containing gas in a plasma state.

The silicon-containing gas and the plasmarized nitrogen-containing gas react on the wafer 100(1) to form a silicon nitride film as a sacrificial film 104(1) on the insulating film 102(1).

(Neutralizing Step AS12)

Here, a neutralizing step AS12 will be described. Since the plasma has been generated in the processing space 209b, the tray 250a is charged. Therefore, the tray 250a is electrostatically adsorbed on the base 210b. If an attempt is made to detach the charged tray 250a from the base 210b, it is conceivable that the wafer 100(1) bounces on the tray 250a. In this case, the wafer 100(1) may be cracked or may come in contact with the deposits adhering to the processing chamber 201, and particles may be accordingly generated.

Therefore, in this step, after the plasma generation is stopped and before the tray 250 is separated from the base 210, the switch 225 is turned on. By turning on the switch 225, electric charges charged in the tray 250 are moved to the ground 226 via the rotating plate 222. In this manner, the tray 250 is neutralized to release the adsorption state.

(Substrate Moving Step AS14)

Here, a substrate moving process AS14 of moving the wafer 100(1) and the wafer 100(2) and loading the wafer 100(3) will be described. Upon completion of the neutralizing step, the rotating tray 222 is raised to separate the tray 250 from the tray mounting surface 211a and the tray mounting surface 211b. Thereafter, the rotating plate 222 is rotated by 90 degrees to mount the tray 250a on the tray mounting surface 211c and the tray 250d on the tray mounting surface 211b. Further, the wafer 100(3) is loaded and mounted on the tray 250c, and the tray 250c is mounted on the tray mounting surface 211a, like the other wafers 100.

While the wafer 100 is being moved, the wafer temperature is maintained by the heat storage part 251.

(Gas Supplying Step AS16)

Here, a gas supplying step AS16 of supplying a gas into the processing space 209a, the processing space 209b and the processing space 209c in which the wafer 100 is placed will be described. Taking the wafer 100 as a main body, the gas supplying step AS16 corresponds to a second insulating film forming step SS06 of the wafer 100(1), corresponds to a first sacrificial film forming step SS04 of the wafer 100(2), and corresponds to a first insulating film forming step SS02 of the wafer 100(3).

(Processing in Processing Space 209a)

In the processing space 209a, a silicon-containing gas and an oxygen-containing gas are supplied onto the wafer 100(3) to form an insulating film 102(1) on the wafer 100(2).

(Processing in Processing Space 209b)

In the processing space 209b, a silicon-containing gas and a nitrogen-containing gas are supplied onto the wafer 100(2). At this time, in order to decompose the nitrogen-containing gas, the plasma generating part 400b places the nitrogen-containing gas in a plasma state.

The silicon-containing gas reacts with the plasmarized nitrogen-containing gas on the wafer 100(2) to form a silicon nitride film as a sacrificial film 104(1) on the insulating film 102(1).

(Processing in Processing Space 209c)

In the processing space 209a, a silicon-containing gas and an oxygen-containing gas are supplied onto the wafer 100(1) to form a silicon oxide film as an insulating film 102(2) on the sacrificial film 104(1).

(Neutralizing Step AS18)

Here, as in the neutralizing step AS12, a neutralizing step AS18 of neutralizing the tray 250 is performed. After the plasma generation is stopped and before the tray 250 is separated, the switch 225 is turned on to neutralize the tray 250.

(Substrate Moving Step AS20)

Here, a substrate moving step AS20 of moving the wafer 100(1), the wafer 100(2) and the wafer 100(3) and loading the wafer 100(4) will be described. Upon completion of the neutralizing step, the rotating plate 222 is raised to separate the tray 250 from the tray mounting surface 211a, the tray mounting surface 211b and the tray mounting surface 211c. Thereafter, the rotating plate 222 is rotated by 90 degrees to mount the tray 250a on the tray mounting surface 211d, the tray 250d on the tray mounting surface 211c, and the tray 250c on the tray, mounting surface 211b. Further, the wafer 100(4) is loaded and mounted on the tray 250b, and the tray 250b is mounted on the tray mounting surface 211a, like the other wafers 100.

While the wafer 100 is being moved, the wafer temperature is maintained by the heat storage part 251.

(Gas Supplying Step AS22)

Here, a gas supplying step AS22 of supplying a gas into the processing space 209a, the processing space 209b, the processing space 209c and the processing space 209d in which the wafer 100 is placed will be described. Taking the wafer 100 as a main body, the gas supplying step AS22 corresponds to a second sacrificial film formation step SS08 of the wafer 100(1), corresponds to a first insulating film formation step SS06 of the wafer 100(2), corresponds to a first sacrificial film forming step SS04 of the wafer 100(3), and corresponds to a first insulating film forming step SS02 of the wafer 100(4).

(Processing in Processing Space 209a)

In the processing space 209a, a silicon-containing gas and an oxygen-containing gas are supplied into the wafer 100(4) to form an insulating film 102(1) on the wafer 100(4).

(Processing in Processing Space 209b)

In the processing space 209b, a silicon-containing gas and a nitrogen-containing gas are supplied onto the wafer 100 (3). At this time, in order to decompose the nitrogen-containing gas, the plasma generating part 400b places the nitrogen-containing gas in a plasma state.

The silicon-containing gas reacts with the plasmarized nitrogen-containing gas on the wafer 100(3) to form a silicon nitride film as a sacrificial film 104(1) on the insulating film 102(1).

(Processing in Processing Space 209c)

In the processing space 209c, a silicon-containing gas and an oxygen-containing gas are supplied onto the wafer 100(2) to form a silicon oxide film as an insulating film 102(2) on the sacrificial film 104(1).

(Processing in Processing Space 209d)

In the processing space 209d, a silicon-containing gas and a nitrogen-containing gas are supplied onto the wafer 100 (1). At this time, in order to decompose the nitrogen-containing gas, the plasma generating part 400*d* places the nitrogen-containing gas into a plasma state.

The silicon-containing gas reacts with the plasmarized nitrogen-containing gas on the wafer 100(1) to form a silicon nitride film as a sacrificial film 104(2) on the insulating film 102(2).

(Neutralizing Step AS24)

Here, as in the neutralizing step AS12, a neutralizing step AS24 of neutralizing the tray 250 is performed. After the plasma generation is stopped and before the tray 250 is separated, the switch 225 is turned on to neutralize the tray 250.

(Substrate Moving Step AS26)

Here, a substrate moving step AS26 of moving the wafer 100(1), the wafer 100(2), the wafer 100(3) and the wafer 100(4) will be described. Upon completion of the neutralizing step, the rotating plate 222 is raised to separate the tray 250 from each tray mounting surface 211. Thereafter, the rotating plate 222 is rotated by 90 degrees to hold each tray 250 on the tray mounting surface 211 of a movement destination.

(Determining Step AS28)

Here, a determining step AS28 will be described. The determining step AS26 corresponds to a determining step SS10 of the wafer 100(1). In this step, it is determined whether or not a combination from the first insulating film forming step S02 to the second sacrificial film forming step SS08 has been performed a predetermined number of times. That is, it is determined whether or not insulating films 102 and sacrificial films 104 are formed in a predetermined number of layers. For example, in the case where the desired total number of insulating films 102 and sacrificial films 104 is 80, it is determined whether or not the above combination is repeated 20 times. In FIG. 8, m=40.

When it is determined that the combination has been performed the predetermined number of times, the process in the substrate processing apparatus 200 is terminated. That is, the wafer 100(1) is unloaded from the substrate processing apparatus 200. At that time, the wafer 100(1) may be substituted with an unprocessed wafer 100. How to unload the wafer 100(1) will be described later.

When it is determined that the combination has not been performed the predetermined number of times, the tray 250 is lowered so as to perform a combination from the gas supplying step AS04 to the substrate moving step AS26.

The determining step AS28 may be performed every time the combination from the first insulating film forming step S02 to the second sacrificial film forming step SS08 is performed for each wafer 100 (the wafer 100(1), the wafer 100(2), . . . , the wafer 100(*n*)).

Here, the reason for providing the heat storage part 251 will be explained. As described above, the heater 213 does not exist between the bases 210. Therefore, if the heat storage part 251 does not exist, the wafer 100 radiates heat, or the heat escapes from the claws of the rotating plate 222, causing the temperature of the wafer 100 to decrease. When the temperature of the wafer 100 decreases, it is necessary to heat the next base 210 so as to compensate for the decreased temperature. Therefore, there is a problem that a processing efficiency drops by the heating time to compensate for the temperature.

Particularly, in the case where the number of times of processing is large as in the present embodiment, the heating time is required to compensate for the temperature every me the processing is performed, thus increasing the processing time significantly.

Further, in the case of the laminated film of this embodiment, the following problem occurs when the temperature decreases. As is generally known, as the number of laminated films increases, a film stress increases. When the temperature of a wafer having a laminated film is lower than the processing temperature or when a wafer once decreased in temperature is subjected to a large temperature change such as rapidly heating the wafer again to a high temperature, the wafer may be bent. If the bent wafer is transferred, particles may be generated due to the wafer falling or colliding with the structure of the processing chamber. Further, the bending of the wafer itself may lead to a collapse of a pattern on the wafer, or the like.

In the present embodiment, the silicon oxide film and the silicon nitride film are laminated, but the silicon oxide film has a high compressive stress and the silicon nitride film has a high tensile stress. Therefor the greater the change in temperature, the more notable the bending becomes.

The collapse of the pattern may be more problematic from the viewpoint of lowering the physical tolerance of a pattern with recent miniaturization.

It is obvious that the production efficiency is reduced due to each of the above problems or a combination thereof. Therefore, in the present embodiment, a change in the temperature of the wafer is also suppressed in each substrate moving step. Specifically, by transferring the tray 250 having the heat storage part 251 between the bases 210, a decrease in wafer temperature is suppressed.

(Unloading Step AS30)

Subsequently, an unloading step AS30 of unloading the wafer 100 will be described.

When the tray 250 is moved onto the tray mounting surface 211*a*, the wafer 100 and the tray 250 are separated by a predetermined distance from each other. For example, the substrate lifting part 216*a* maintains the wafer 100(1) at a predetermined height and the rotating plate 222 lowers the tray 250*a*. By separating the tray 250 from the wafer 100, the temperature of the wafer 100(1) can be decreased. By decreasing the temperature, it is possible to reduce the heat load on the arm 240 when transferring the wafer 100(1) to the arm 240, thereby preventing thermal sagging of the arm 240, etc.

Subsequently, the gate valve 208 is opened and the wafer 100(1) is replaced with an unprocessed water 100(5). Thereafter, the processing from the gas supplying step AS04 to the determining step AS28 is repeated until processing for a predetermined number of substrates is completed.

OTHER EMBODIMENTS

Other embodiments will be described below. It has been illustrated in the present embodiment that the substrate lifting part and the rotating plate lifting part are used independently with different configurations. However, they may be used in any combinations as long as they can be independently lifted up and down.

In addition, it has been illustrated in the present embodiment that no plasma is used for the first insulating film forming step SS02 and the second insulating film forming step SS06. However, the present disclosure is not limited thereto but plasma may be used for these steps SS02 and SS06.

Further, in the present embodiment, a lamination of insulating films and sacrificial films has been described by way of an example. However, the present disclosure is not limited thereto but may be applied to a lamination of different types of films and further a lamination of the same types of thick films.

According to the present disclosure in some embodiments, it is possible to provide a technique with high processing efficiency even in an apparatus of a type in which a plurality of substrates are arranged circumferentially.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a rotary shaft;
   a rotating plate supported by the rotary shaft;
   a plurality of bases arranged circumferentially around the rotary shaft;
   a plasma generating part including a high frequency power supply and a high frequency power supply line, and configured to generate plasma above the bases;
   a tray including:
     a substrate mounting surface on which a substrate is mounted;
     a neutralizing electrode disposed inside the tray such that the tray covers the neutralizing electrode so as not to expose the neutralizing electrode to the plasma when the tray is placed on the rotating plate;
     an empty space disposed between an upper portion of the tray and the neutralizing electrode; and
     a terminal;
   a heater provided for each of the bases; and
   a switch having one side electrically connected to the rotating plate and the other side connected to a ground,
   wherein the terminal electrically connects the neutralizing electrode and the rotating plate when the tray is placed on the rotating plate.

2. The substrate processing apparatus of claim 1, wherein the terminal is arranged on an outer side of a diameter of the substrate in a horizontal direction.

3. The substrate processing apparatus of claim 2, wherein the switch is turned off while the plasma generating part generates the plasma, and is turned on after the plasma generating part stops the plasma generation until the tray is separated from the rotating plate.

4. The substrate processing apparatus of claim 2, wherein, when the tray is mounted on the rotating plate, a hole through which the terminal passes is blocked by the rotating plate.

5. The substrate processing apparatus of claim 2, further comprising a plurality of lift pins configured to lift the substrate,
   wherein the rotating plate is configured to lift the tray, and
   wherein, when the substrate is unloaded from the tray, the plurality of lift pins and the rotating plate are controlled to separate the substrate from the tray.

6. The substrate processing apparatus of claim 1, wherein, when the tray is mounted on the rotating plate, a hole through which the terminal passes is blocked by the rotating plate.

7. The substrate processing apparatus of claim 1, wherein the switch is turned off while the plasma generating part generates the plasma, and is turned on after the plasma generating part stops the plasma generation and until the tray is separated from the rotating plate.

8. The substrate processing apparatus of claim 7, further comprising a plurality of lift pins configured to lift the substrate,
   wherein the rotating plate is configured to lift the tray, and
   wherein, when the substrate is unloaded from the tray, the plurality of lift pins and the rotating plate are controlled to separate the substrate from the tray.

9. The substrate processing apparatus of claim 1, further comprising a plurality of lift pins configured to lift the substrate,
   wherein the rotating plate is configured to lift the tray, and
   wherein, when the substrate is unloaded from the tray, the plurality of lift pins and the rotating plate are controlled to separate the substrate from the tray.

* * * * *